United States Patent [19]

Ding et al.

[11] Patent Number: 5,763,135
[45] Date of Patent: Jun. 9, 1998

[54] LIGHT SENSITIVE COMPOSITION CONTAINING AN ARYLHYDRAZO DYE

[75] Inventors: Shuji Ding, Somerville; Ping-Hung Lu, Bridgewater; Dinesh N. Khanna; Anthony J. Corso, both of Flemington, all of N.J.

[73] Assignee: Clariant Finance (BVI) Limited, Virgin Islands (Br.)

[21] Appl. No.: 722,711

[22] Filed: Sep. 30, 1996

[51] Int. Cl.$^6$ .............................. G03F 7/023; G03F 7/32
[52] U.S. Cl. .................... 430/191; 430/192; 430/193; 430/270.1; 430/326; 430/330
[58] Field of Search ............................. 430/191, 510, 430/192, 193, 270.1, 326, 330

[56] References Cited

U.S. PATENT DOCUMENTS

| | | |
|---|---|---|
| 3,869,292 | 3/1975 | Peters ................................ 96/115 R |
| 4,439,516 | 3/1984 | Cernigliaro et al. .................. 430/323 |
| 4,927,732 | 5/1990 | Merrem et al. ...................... 430/191 |
| 5,043,243 | 8/1991 | Yajima et al. ....................... 430/191 |
| 5,108,870 | 4/1992 | Shalom .............................. 430/191 |
| 5,354,644 | 10/1994 | Yamamoto et al. .................. 430/191 |

OTHER PUBLICATIONS

"Chemistry and Application of Phenolic Resins", Knop A. and Scheib, W.; Springer Verlag, NY 1979 Chapter 4.

"Light Sensitive Systems", Kosar, J.; John Wiley & Sons, NY, 1965, Chapter 7.4.

*Primary Examiner*—John S. Chu
*Attorney, Agent, or Firm*—Sangya Jain

[57] ABSTRACT

A light-sensitive positive photoresist composition containing a film forming resin, a photoactive compound, a solvent, and an arylhydrazo dye. The dyed photoresist reduces the linewidth variation of the resist pattern on a reflective substrate while giving good lithographic performance.

18 Claims, No Drawings

LIGHT SENSITIVE COMPOSITION CONTAINING AN ARYLHYDRAZO DYE

BACKGROUND OF THE INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives.

The photoresist is often applied to a reflective metal substrate surface and/or applied to a topographical surface of a semiconductor device during the photolithography process. The interference effect resulting from the reflected light from these reflective substrates during the exposure step may cause pattern linewidth variation, the problem is especially severe when the substrate surface is both highly reflective and topographical, since the light reflecting from such a surface is often unpredictable. This results in both a loss of fidelity of a reproductive resist pattern typically known as reflective notching and also in large variations in linewidth of the imaged photoresist pattern as the thickness of the photoresist over the substrate changes. The present invention is directed to the reduction of linewidth variation, measured as Swing Reducion Ratio, during the processing of these photoresists, especially over highly reflective topographical substrates.

The addition of dyes to photoresists has been suggested previously. The choice of dye in a photoresist is based on satisfying several important criteria, such as, compatability with the novolak/diazonaphthoquinone chemical system and the resist casting solvent, strong absorption at the exposure wavelength used to image-wise expose the resist, high extinction coefficient at the exposing wavelength and minimal impact on the lithographic performance of the photoresist. Some of these lithographic performance parameters are photosensitivty, resolution, sidewall edge acuity, and depth of focus. Typical photoresists that do not contain dyes exhibit reflective notching and large variations in the critical dimensions as the film thickness changes over topographical features in the substrate. As the circuitry on the semiconductor device becomes more sophisticated, more and more topograghy is being introduced on the substrate and the need for photoresists that can reduce the large variations of linewidth as the photoresist film thickness changes, known as linewidth swing ratio, is becoming critical. Reduction, or more preferably elimination, of this swing ratio provides a distinct process control advantage when choosing the preferred type of photoresist for use in manufacturing semiconductor devices. In the final choice of dyed photoresist all the lithographic characteristics mentioned above must be maximized to give the best performance and maximum process control.

The novel dye of the instant invention is used in a photoresist composition to give a film of good quality, provide high absorption and give good lithographic performance, especially minimizing the effects of reflectivity.

SUMMARY OF INVENTION

The positive photoresist composition of the present invention is for reducing the variation of critical linewidth dimensions resulting from photoresist film thickness changes, known as linewidth swing ratio, and reducing reflective notching, where the photoresist composition comprises an admixture of a film-forming resin, a photoactive compound, a solvent and a novel dye comprising the structure:

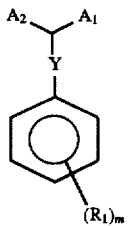

where $A_1$ and $A_2$ are independently an electronwithdrawing group, preferrably $COR_1$, CN or CNZ, $R_1$ is H, $(C_1-C_{10})$alkyl, $(C_1-C_{10})$alkoxy, nitro, halide, cyano, aryl, alkylaryl, dicyanovinyl, $SO_2CF_3$, COOZ, $SO_3Z$, COZ, OZ, $NZ_2$, SZ, $SO_2Z$, NHCOZ or $SO_2NZ_2$, where Z is H or $(C_1-C_{10})$alkyl, Y is a conjugated moiety e.g. N=N, CW=CW, CW=N, or N=CW, where W is H, $(C_1-C_{10})$alkyl or $(C_1-C_{10})$ alkoxy, and m=1–5.

The more preferred structure for the dye is,

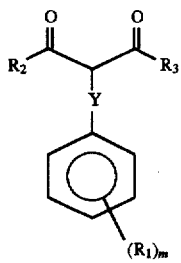

where $R_1-R_3$ are independently H, $(C_1-C_{10})$alkyl, $(C_1-C_{10})$alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ or $SO_2NZ_2$, where Z is H or $(C_1-C_{10})$alkyl, Y is a conjugated moiety e.g. N=N, CW=CW, CW=N, N=CW, where W is H, $(C_1-C_{10})$alkyl or $(C_1-C_{10})$ alkoxy, and m=1–5.

The current invention further comprises a method of forming a photoresist image on a substrate using the novel photoresist composition of this invention.

DETAILED DESCRIPTION OF THE PREFERRED EMBODIMENT

The present invention provides for a light-sensitive positive photoresist composition comprising a film-forming resin, a photoactive compound, a solvent and a novel dye comprising the structure,

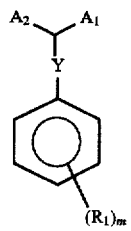

where $A_1$ and $A_2$ are independently an electronwithdrawing group, preferrably COR, CN or CNZ, $R_1$ is H, $(C_1-C_{10})$alkyl, $(C_1-C_{10})$alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ or $SO_2NZ_2$, where Z is H or $(C_1-C_{10})$alkyl, Y is a conjugated moiety e.g. N=N, CW=CW, CW=N, or N=CW, where W is H, $(C_1-C_{10})$alkyl or $(C_1-C_{10})$ alkoxy, and m=1–5.

The more preferred structure for the dye is,

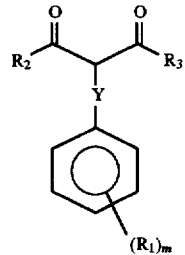

where $R_1-R_3$ are independently H, $(C_1-C_{10})$alkyl, $(C_1-C_{10})$ alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ or $SO_2NZ_2$, where Z is H or $(C_1-C_{10})$alkyl, Y is a conjugated moiety e.g. N=N, CW=CW, CW=N, or N=CW, where W is H, $(C_1-C_{10})$alkyl or $(C_1-C_{10})$ alkoxy, and m=1–5.

The invention further provides for a process for coating and imaging the light-sensitive composition of this invention.

The production of film forming resins, such as novolak resins or polyvinylphenols, which may be used for preparing photosensitive compositions, are well known in the art. A procedure for the manufacture of novolak resins is described in Chemistry and Application of Phenolic Resins, Knop A. and Scheib, W.; Springer Verlag, N.Y., 1979 in Chapter 4 which is incorporated herein by reference. Paravinyl phenols and polyvinyl phenols are described in U.S. Pat. No. 3,869, 292 and U.S. Pat. No. 4,439,516, which are incorporated herein by reference. Similarly, the use of o-diazonaphthoquinones as photoactive compounds is well known to the skilled artisan, as demonstrated by Light Sensitive Systems, Kosar, J.; John Wiley & Sons, N.Y., 1965 in Chapter 7.4, which is also incorporated herein by reference. These sensitizers which comprise a component of the present invention are preferably substituted diazonaphthoquinone sensitizers, which are conventionally used in the art in positive photoresist formulations. Useful photosensitizers include, but are not limited to, the sulfonic acid esters made by condensing phenolic compounds such as hydroxy benzophenones, oligomeric phenols and multisubstituted-multihydroxyphenyl alkanes with naphthoquinone-(1,2)- diazide-5-sulfonyl chloride or naphtho-quinone-(1,2)-diazide-4-sulfonyl chlorides.

In the preferred embodiment, the solid parts of the photoresist composition, the novolak resin, the dye and the diazonaphthoquinone, preferably range from 15% to about 99% resin with from about 1% to about 85% diazonaphthoquinone. A more preferred range of resin would be from about 50% to about 90% and most preferably from about 65% to about 85% by weight of the solids photoresist components. A more preferred range of the diazonaphthoquinone would be from about 10% to about 50% and most preferably from about 15% to about 35%, by weight of the solid in the photoresist. In accordance with the present invention the amount of dye added to the light-sensitive composition ranges from about 0.25% to about 5%, and preferably from about 0.5% to about 3.0% by weight of total resist. In manufacturing the photoresist composition, the resin and the diazonaphthoquinone are mixed with the solvent, such that the solvent mixture is present in an amount of from about 40% to about 90% by weight of the overall photoresist composition. A more prefered range is from about 60% to about 83% and most preferably from about 65% to about 70% by weight of the overall photoresist composition.

Additives such as colorants, non-actinic dyes, anti-striation agents, plasticizers, adhesion promoters, coating aids, speed enhancers and surfactants may be added to the solution of resin, sensitizer, dye and solvent system before the solution is coated onto a substrate.

Suitable solvents for such photoresists may include propylene glycol mono-alkyl ether, propylene glycol alkyl (e.g. methyl) ether acetate, ethyl-3-ethoxypropionate, xylene, diglyme, amyl acetate, ethyl lactate, butyl acetate, 2-heptanone, ethylene glycol monoethyl ether acetate, and mixtures thereof.

Other photoresist systems that contain polyhydroxystyrene resins or substituted polyhydroxystyrenes can also be used in conjunction with photoactive compounds. These may additionally contain dissolution inhibitors. These photoresists are well known in the art and are sensitive to radiation in the deep ultraviolet.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to aluminum/aluminum oxide coated wafers, such as are utilized in the production of microprocessors and other miniaturized integrated circuit components. A silicon/silicon dioxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron (micrometer) in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 180 nm (nanometers) to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLE 1

Diazonium Salt Formation

4-Nitroaniline (13.8 g, 0.1 mol) was charged to a jacketed 800 ml beaker at room temperature, along with 50 ml of 6N HCl and 10 ml water. This mixture was mechanically stirred at room temperature for 20 minutes, then cooled to 0° C. To the beaker was added dropwise a pre-chilled sodium nitrite solution (7.6 g, 0.11 mol in 15 ml water). The addition was exothermic and the temperature was kept at 0°–5° C. The reaction was also monitored for excess nitrite using KI paper (potassium iodide-starch test paper); the paper turned immediately dark blue/black in the presence of excess nitrite. If excess nitrite was present during the addition, the addition rate was slowed to allow time for the nitrite to react with the starting material. The addition was completed within approximately 20 to 30 minutes; excess nitrite should be present 10 minutes after the addition is completed; if not, an additional 5 to 10 mol % sodium nitrite should be added. The diazonium salt mixture was stirred for 1 hour at 0° C., after which any excess nitrite was neutralized using approximately 1 ml of a 10 wt % aqueous sulfamic acid solution. This diazonium salt solution was maintained at 0° C. for the coupling reaction.

Coupling Reaction

Ethyl acetoacetate (13 g, 12.7 ml, 0.1 mol), 35 ml pyridine, and 100 ml of deionized water was added to a pre-chilled 800 ml jacketed beaker at 0° C.; mechanical stirring, thermometer, and pH probe were added. The diazonium salt solution was added dropwise over approximately 20 minutes while monitoring temperature (<10° C.) and pH. An additional 100 ml deionized water was added at end of the addition. The coupling reaction was stirred at 0° C. for approximately 30 minutes. The resulting solid dye was vacuum filtered. The dye was reslurried in 5% aqueous acetic acid for 5 minutes and vacuum filtered. A final slurry in deionized water for 10 minutes was done to remove residual acetic acid, and then vacuum filtered. The dye was transferred to a crystallizing dish and dried in a vacuum oven. The UV-Vis spectrum in ethyl lactate showed a peak at 371 nm and gave an extinction coefficient of 120 ml/g.L.

EXAMPLE 2

Diazonium Salt Formation

4-Aminoacetanilide (15.0 g, 0.1 mol) was charged to a beaker at room temperature, along with 75 ml of 6N HCl. This mixture was magnetically stirred at room temperature for 30 minutes, then cooled to 0° C. To the beaker was added dropwise a pre-chilled sodium nitrite solution (7.6 g, 0.11 mol in 20 ml water). The addition was exothermic and the temperature was kept at <5° C. The reaction was also monitored for excess nitrite using KI paper (potassium iodide-starch test paper); the paper turned immediately dark blue/black in the presence of excess nitrite. If excess nitrite was present during the addition, the addition rate was slowed to allow time for the nitrite to react with the starting material. The addition was completed within approximately 60 minutes; excess nitrite should be present 10 minutes after the addition is completed; if not, an additional 5 to 10 mol % sodium nitrite shoul be added. The diazonium salt mixture was stirred for 1 hour at approximately 5° C., after which any excess nitrite was neutralized using approximately 1 ml of a 10 wt % aqueous sulfamic acid solution. This diazonium salt solution was maintained at approximately 0° C. for the coupling reaction.

Coupling Reaction

Ethyl acetoacetate (13.0 g, 0.1 mol), 35 ml pyridine, and 100 ml of deionized water was added to a jacketed 800 ml beaker at approximately 0° C.; mechanical stirring, thermometer, and pH probe were added. The diazonium salt solution was added dropwise over approximately 60 minutes while monitoring temperature (<10° C.) and pH. The coupling reaction was stirred at approximately 0° C. for approximately 1 hour. The resulting solid dye was vacuum filtered, and then washed with water on the filter cake. The material was further purified by dissolving the product in tetrahydrofuran and precipitating into twice as much hexane, and vacuum filtering. The dye was transferred to a crystallizing dish and dried in a vacuum oven. Analysis by HPLC showed the product to be 95% pure. The UV-Vis spectrum in ethyl lactate showed a peak at 371 nm and gave an extinction coefficient of 84 ml/g.L.

EXAMPLE 3

Diazonium Salt Formation

Ethyl 4-aminobenzoate (16.5 g, 0.1 mol) was charged to a beaker at room temperature, along with 50 ml of 6N HCl. This mixture was magnetically stirred at room temperature for 30 minutes, then cooled to 0° C. To the beaker was added dropwise a pre-chilled sodium nitrite solution (7.6 g, 0.11 mol in 15 ml water). The addition was exothermic and the temperature was kept at <5° C. The reaction was also monitored for excess nitrite using KI paper (potassium iodide-starch test paper); the paper turned immediately dark blue/black in the presence of excess nitrite. If excess nitrite was present during the addition, the addition rate was slowed to allow time for nitrite to react with the starting material. The addition was completed within approximately 60 minutes; excess nitrite should be present 10 minutes after the addition is completed; if not, an additional 5 to 10 mol % sodium nitrite was added. The diazonium salt mixture was stirred for 1 hour at approximately 5° C., after which any excess nitrite was neutralized using approximately 1 ml of a 10 wt % aqueous sulfamic acid solution. This diazonium salt solution was maintained at approximately 0° C. for the coupling reaction.

Coupling Reaction

Acetoacetamide (10.1 g, 0.1 mol), 35 ml of pyridine, 250 ml of deionized water, and 50 g ice was added to a 2000 ml beaker at approximately 0° C. (ice/sodium chloride bath); mechanical stirring, thermometer, and pH probe were added. The diazonium salt solution was added dropwise over approximately 20 minutes while monitoring temperature (<10° C.) and pH. An additional 550 ml deionized water was added at end of the addition. The coupling reaction was stirred at approximately 0° C. for approximately 1 hour. The resulting solid dye was vacuum filtered. The dye was reslurried in 500 ml 1N HCl for 20 minutes and vacuum filtered. A final slurry in 500 ml deionized water for 10 minutes was formed to remove residual acid, and then vacuum filtered. The dye was transferred to a crystallizing dish and dried in a vacuum oven, yielding 24 grams. The UV-Vis spectrum in ethyl lactate showed a peak at 364.4 nm and gave an extinction coefficient of 141 ml/g.L.

EXAMPLE 4

Diazonium Salt Formation

Ethyl 4-aminobenzoate (16.5 g, 0.1 mol) was charged to a beaker at room temperature, along with 50 ml of 6N HCl. This mixture was magnetically stirred at room temperature for 30 minutes, then cooled to 0° C. To the beaker was added dropwise a pre-chilled sodium nitrite solution (7.6 g, 0.11 mol in 15 ml water). The addition was exothermic and the temperature was kept between approximately 0°–5° C. The reaction was also monitored for excess nitrite using KI paper (potassium iodide-starch test paper); the paper turned immediately dark blue/black in the presence of excess nitrite. If excess nitrite was present during the addition, the addition rate was slowed to allow time for nitrite to react with the starting material. The addition was completed within approximately 30 minutes; excess nitrite should be present 10 minutes after the addition is completed; if not, an additional 5 to 10 mol % sodium nitrite should be added. The diazonium salt mixture was stirred for 1 hour at approximately 5° C., after which any excess nitrite was neutralized using approximately 1 ml of a 10 wt % aqueous sulfamic acid solution. This diazonium salt solution was maintained at approximately 0° C. for the coupling reaction.

Coupling Reaction

Ethyl acetoacetate (13.0 g, 0.1 mol), 35 ml of pyridine, 250 ml of deionized water, and 50 g ice was added to a 1000 ml beaker at approximately 0° C. (ice/sodium chloride bath); mechanical stirring, thermometer, and pH probe were added. The diazonium salt solution was added dropwise over approximately 60 minutes while monitoring temperature (<10° C.) and pH. The coupling reaction was stirred at approximately 0° C. for approximately 1 hour. The resulting solid dye was vacuum filtered. The dye was reslurried in 500 ml of 1N HCl for 20 minutes and vacuum filtered. A final slurry in 500 ml deionized water for 10 minutes was done to remove residual acid, and then vacuum filtered. The dye was transferred to a crystallizing dish and dried in a vacuum oven, yielding 28 grams. TLC with mobile phase 2:1 ethyl acetate:hexane showed single product spot, compared with starting materials. The UV-Vis spectrum in ethyl lactate showed a peak at 355 nm and extinction coefficient of 107 ml/g.L.

EXAMPLE 5

Diazonium Salt Formation

Ethyl 4-aminobenzoate (57.8 g, 0.35 mol) was charged to a beaker at room temperature, along with 233 ml (4 mol equivalents) of 6N HCl. This mixture was magnetically stirred at room temperature for 30 minutes, then cooled to 0° C. (with ice/sodium chloride bath). To the beaker was added dropwise a pre-chilled sodium nitrite solution (25.5 g, 0.37 mol in approximately 35 ml water). The addition was exothermic and the temperature was kept between approximately 0°–5° C. The reaction was also monitored for excess nitrite using KI paper (potassium iodide-starch test paper); the paper turned immediately dark blue/black in the presence of excess nitrite. If excess nitrite was present during the addition, the addition rate was slowed to allow time for nitrite to react with the starting material. The addition was completed within approximately 30 minutes; excess nitrite should be present 10 minutes after the addition is completed; if not, an additional 5 to 10 mol % sodium nitrite should be added. The diazonium salt mixture was stirred for 1 hour at approximately 5° C., after which any excess nitrite was neutralized using approximately 1 ml of a 10 wt % aqueous sulfamic acid solution. This diazonium salt solution was maintained at approximately 0° C. for the coupling reaction.

Coupling Reaction

Allyl acetoacetate (49.8 g, 0.35 mol), 100 ml pyridine, 500 ml of deionized water was added to a beaker at approximately 0° C. (ice/sodium chloride bath); mechanical stirring, thermometer, and pH probe were added. The diazonium salt solution was added dropwise over approximately 60 minutes while monitoring temperature (<10° C.) and pH. The coupling reaction was stirred at approximately 0° C. for approximately 1 hour. The resulting solid dye was vacuum filtered. The dye was reslurried in 500 ml 1N HCl for 20 minutes and vacuum filtered. A final slurry in 500 ml deionized water for 10 minutes was done to remove residual acid, and then vacuum filtered. The dye was transferred to a crystallizing dish and dried in a vacuum oven. The UV-Vis spectrum in ethyl lactate showed a peak at 355 nm and gave an extinction coefficient of 91 ml/g.L.

EXAMPLES 6–12

Table 1 shows the arylhydrazo dyes synthesized using the synthetic procedures described in Examples 1–5 and gives the peak absorption ($\lambda$max) and extinction coefficents ($\epsilon$) for these dyes.

TABLE 1

| Example | Dye | $\lambda$max (nm) | $\epsilon$ (ml/g.L) |
|---|---|---|---|
| 6 | $R_1$ = $NO_2$, $R_2$ = OMe, $R_3$ = Me | 370 | 118 |
| 7 | $R_1$ = $NO_2$, $R_2$ = OH, $R_3$ = Me | 383 | 108 |
| 8 | $R_1$ = NHCOMe, $R_2$ = $R_3$ = Me | 391 | 72 |
| 9 | $R_1$ = COOH, $R_2$ = $NH_2$, $R_3$ = Me | 371 | 144 |
| 10 | $R_1$ = COOH, $R_2$ = OEt, $R_3$ = Me | 353 | 106 |
| 11 | $R_1$ = COOEt, $R_2$ = OX, $R_3$ = Me | 355 | 79 |
| 12 | $R_1$ = OH, $R_2$ = OEt, $R_3$ = Me | 375 | 82 |

X = $CH_2CH_2OCOC(CH_3)CH_2$

EXAMPLE 13

The dyed resist samples were prepared by adding 0.341 grams of each dye from Example 2, 3, 5 to 70 gram of a commercial i-line positive photoresist AZ® 7908 (available from Hoechst Celanese Corporation, AZ Photoresist Products Division, 70 Meister Ave, Somerville, N.J. 08876).

For UV (ultraviolet) film absorbance measurement, each dyed resist sample was spun coated on a 4" quartz wafer then soft baked (SB) on a hot plate at 90° C. for 60 seconds to a film thickness of 1 µm (micrometer). The resist film thickness was measured with a NanoSpec® AFT thickness measurement tool. The UV absorbance of each resist at 365 nm was measured with a Perkin Elmer® Lamda® 4 UV-VIS spectrometer using a blank quartz as the reference.

In order to measure the % swing ratio reduction for the dyed resists, each dyed resist sample was spin coated on several 4" silicon wafers and soft baked on a hot plate at 90° C. for 90 seconds to achieve a film thickness of 0.4–1.0 µm (micrometers). Resist film thickness was measured with a NanoSpec® g AFT thickness measurement tool. The coated wafers were exposed on a NIKON® 0.54 NA i-line stepper with a NIKON® resolution reticle which contained various sizes of lines and space (L/S) pattern from 2 to 0.2 µm (micrometers). A 11×11 exposure array was printed on the wafer and then post exposure baked (PEB) on a hot plate at 110° C. for 60 seconds. The exposed wafers thus produced were spray-puddle developed with 2.38% TMAH MIF (metal ion free) developer for 70 seconds at 23° C. The minimum exposure dose required to clear the resist film at the best stepper focus was reported as the dose-to-clear (DTC or Eo). The DTC measurement of each wafer was plotted as a function of resist film thickness. A sinusoidal curve was obtained where the difference of the DTC at the adjacent maximum, Emax, (at the resist thickness of ca.

0.765 μm (micrometers)) and minimum, Emin, (at the resist thickness of ca. 0.7 μm (micrometers)) of the sinusoidal curve was used to calculate the swing ratio of each resist by the following equation:

% Swing Ratop=((Emax−Emin)/((Emax+Emin)/2))×100

For reflective notching evaluation, each resist was coated with a thickness of 0.974 μm on a aluminum wafer, each resist sample was spin coated on a 4" aluminum wafers using a SVG® track coater. The coated wafers were soft baked on a hot plate at 90° C. for 90 seconds. Resist film thickness was measured with a NanoSpec® AFT thickness measurement tool. The coated wafers were exposed on a NIKON® 0.54 NA i-line stepper with a NIKON® resolution reticle which contained various sizes of lines and spaces (L/S) pattern from 2 to 0.2 μm (micrometers). A 15×21 focus/exposure array was printed on the wafer and then post exposure baked (PEB) on a hot plate at 110° C. for 60 seconds. The exposed wafers thus produced were spray-puddle developed with 2.38% TMAH MIF (metal ion free) developer for 70 seconds at 23° C. The minimum exposure dose required to reproduce the 0.34 μm (micrometers) line pattern at the best stepper focus was reported as the dose-to-print (DTP). The resist pattern was evaluated on a HITACHI®-S4000 SEM.

TABLE 2

Summary of the direct lithographic comparison of the dyes tested

| Sample | Dye | Dye Loading % Wt. | % Swing Ratio Reduction from Control | DTP (mJ/cm$^2$) | Resolution |
|---|---|---|---|---|---|
| 1 | None | 0 | 0.00 | 170 | ~0.34μm |
| 2 | Example 2 | 0.48 | 16.06 | 190 | 0.32μm |
| 3 | Example 3 | 0.48 | 3.10 | 205 | 0.34μm |
| 4 | Example 5 | 0.48 | 4.64 | 210 | 0.32μm |

It is clearly seen in Table 2 that dyed resists containing the dyes described in Examples 2, 3, and 5 effectively reduce the resist swing ratio and improve resolution over highly reflective aluminum substrate without significantly reducing the resist photosensitivity.

EXAMPLE 14

The dyed resist sample was prepared by adding 1.24 gram of the dye from Example 1 to 200 grams of a commercial i-line positive photoresist AZ® 7820 (available from Hoechst Celanese Corporation, AZ Photoresist Products Division, 70 Meister Ave, Somerville, N.J. 08876). A swing curve for AZ® 7820 and the dyed AZ® 7820 was generated by the same method described in Example 13. The dye of this example effectively reduced the resist swing ratio by 18%.

TABLE 3

| Sample | Dye | Emax (mJ/cm$^2$) | Emin (mJ/cm$^2$) | % Swing | % Swing Reduction |
|---|---|---|---|---|---|
| AZ ® 7820 | None | 153.42 | 122 | 22.82 | 0 |
| Dyed AZ ® 7820 | Example 1 | 224.19 | 185.91 | 18.67 | 18 |

We claim:
1. A positive photoresist composition comprising an admixture of a film-forming resin, a photoactive compound, a solvent and a dye comprising the structure,

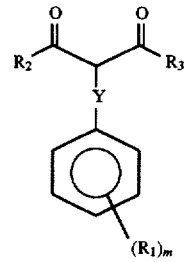

where $R_1$–$R_3$ are independently H, ($C_1$–$C_{10}$)alkyl, ($C_1$–$C_{10}$) alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ or $SO_2NZ_2$, where Z is H or ($C_1$–$C_{10}$)alkyl,
Y is a conjugated moiety e.g. N=N, CW=CW, CW=N, or N=CW, where W is H, ($C_1$–$C_{10}$)alkyl or ($C_1$–$C_{10}$) alkoxy, and
m=1–5.

2. The photoresist composition according to claim 1, wherein the organic solvent is selected from a group consisting of propylene glycol mono-alkyl ether, propylene glycol methyl ether acetate, 2-heptanone, butyl acetate, amyl acetate, ethyl-3-ethoxypropionate, ethyl lactate, ethylene glycol monoethyl ether acetate, ethyl lactate, and mixtures thereof.

3. The composition of claim 1, wherein the photoactive compound is present in an amount of from about 1 to about 35 weight percent and the novolak resin is present in an amount from about 65 to about 95 weight percent, based on the non-solvent components of the photoresist composition.

4. The composition of claim 1, wherein the dye in the photoresist composition ranges from about 0.25 weight percent to about 5 weight percent of the total weight of the photoresist composition.

5. The composition of claim 1, further comprising one or more additives selected from a group consisting of colorants, leveling agents, anti-striation agents, plasticizers, adhesion promoters, speed enhancers and surfactants.

6. The photoresist composition according to claim 1, wherein the photoactive compound is a reaction product of a diazonaphthoquinone sulfonyl residue and a phenolic residue.

7. The photoresist composition according to claim 6, wherein the phenolic residue is selected from a group consisting of multihydroxybenzophenones, multihydroxyphenylalkanes, phenolic oligomers, and mixtures thereof.

8. The photoresist composition according to claim 6, wherein the naphthoquinone sulfonyl residue is selected from a group consisting of 2,1,4-diazonaphthoquinone sulfonyl, 2,1,5- diazonaphthoquinone sulfonyl, or mixtures thereof.

9. The photoresist composition according to claim 1, wherein the resin is a novolak resin.

10. The photoresist composition according to claim 9, wherein the novolak resin is an acid catalysed condensation product of an aldehyde and one or more substituted phenolic monomers.

11. The photoresist composition according to claim 1, wherein the resin is polyhydroxystyrene.

12. The photoresist composition according to claim 1, wherein the resin is substituted polyhydroxystyrene.

13. A method for producing a photoresist image on a substrate, which comprises:

a) coating a substrate with a positive photoresist composition from claim 2, b) heat treating the coated substrate until substantially all of said solvent composition is removed;

c) imagewise exposing the coated photoresist composition to actinic radiation;

d) removing the imagewise exposed areas of said coated photoresist composition with a developer; and e) optionally, heating the substrate either before or after the removing step.

14. The method of claim 13 further comprising heating said coated substrate from a temperature of from about 90° C. to about 150° C. for from about 30 seconds to about 180 seconds on a hot plate or from about 15 minutes to about 40 minutes in an oven after the exposure step but before the developing step.

15. The method of claim 13 further comprising heating said coated substrate at a temperature of from about 90° C. to about 150° C. for about 30 second to about 180 seconds on a hot plate or for from about 15 minutes to about 40 minutes in an oven after the developing step.

16. The method of claim 13, wherein the exposure step is conducted with radiation having a wavelength from about 180 nm to about 450 nm.

17. The method of claim 13, wherein the developer is an aqueous alkaline solution.

18. The method of claim 13, wherein the developer is an aqueous solution of tetramethylammonium hydroxide.

* * * * *

UNITED STATES PATENT AND TRADEMARK OFFICE
CERTIFICATE OF CORRECTION

PATENT NO. : 5,763,135  
DATED : June 9, 1998  
INVENTOR(S) : Ding, et al

Page 1 of 3

It is certified that error appears in the above-identified patent and that said Letters Patent is hereby corrected as shown below:

On the title page, under item [56], insert the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 2 | 4 | 0 | 8 | 0 | 7 | 8/93 | Jain et al | | | |
| | | 5 | 3 | 6 | 2 | 5 | 9 | 8 | 11/94 | Takeyama et al | | | |
| | | 4 | 1 | 3 | 5 | 0 | 0 | 7 | 1/79 | Lorenz et al | | | |
| | | 3 | 7 | 6 | 4 | 3 | 2 | 1 | 10/73 | Kampfer et al | | | |
| | | | | | | | | | | | | | |

UNITED STATES PATENT AND TRADEMARK OFFICE
CERTIFICATE OF CORRECTION

PATENT NO. : 5,763,135
DATED : June 9, 1998
INVENTOR(S) : Ding, et al

It is certified that error appears in the above-identified patent and that said Letters Patent is hereby corrected as shown below:

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 5 | 2 | 1 | 4 | 3 | 0 | | 4/72 | CH | | | | |
| | | 9 | 9 | 9 | 0 | 9 | 7 | | 7/65 | GB | | | | |
| | | | | | | | | | | | | | | |

UNITED STATES PATENT AND TRADEMARK OFFICE
CERTIFICATE OF CORRRECTION

PATENT NO. : 5,763,135
DATED : June 9, 1998
INVENTOR(S) : Ding et al It is certified that error appears in the above-identified patent and that said Letters Patent is hereby corrected as shown below:

OTHER DOCUMENTS

|  |  |  |
|--|--|--|
|  |  | Patent Abstracts of Japan, vol. 12, no. 288 (P-741), 8 August 1988 - JP 63 064044 A |
|  |  | (Fuji Photo Film Co., Ltd.), 22 March 1988 |
|  |  |  |

Signed and Sealed this

Second Day of March, 1999

*Attest:*

Q. TODD DICKINSON

*Attesting Officer*    Acting Commissioner of Patents and Trademarks